US009720043B2

(12) United States Patent
Boxshall et al.

(10) Patent No.: US 9,720,043 B2
(45) Date of Patent: Aug. 1, 2017

(54) TESTING A FUSE

(71) Applicant: Vetco Gray Controls Limited, Nailsea Bristol (GB)

(72) Inventors: Timothy Adam Boxshall, Nailsea Bristol (GB); Julian Jefferis, Nailsea Bristol (GB)

(73) Assignee: GE Oil & Gas UK Limited, Bristol (GB)

( * ) Notice: Subject to any disclaimer, the term of this patent is extended or adjusted under 35 U.S.C. 154(b) by 14 days.

(21) Appl. No.: 13/729,287

(22) Filed: Dec. 28, 2012

(65) Prior Publication Data

US 2014/0062492 A1 Mar. 6, 2014

(30) Foreign Application Priority Data

Sep. 6, 2012 (EP) .................................. 12183277

(51) Int. Cl.
*G01R 31/327* (2006.01)
*G01R 31/12* (2006.01)
G01R 35/00 (2006.01)
G01R 31/07 (2006.01)

(52) U.S. Cl.
CPC ........ *G01R 31/327* (2013.01); *G01R 31/1272* (2013.01); *G01R 31/07* (2013.01); *G01R 35/00* (2013.01)

(58) Field of Classification Search
CPC .. G01R 31/327; G01R 31/1272; G01R 35/00; G01R 31/07
USPC ......................................................... 324/415
See application file for complete search history.

(56) References Cited

U.S. PATENT DOCUMENTS

| 5,514,967 A | 5/1996 | Zelm | |
|---|---|---|---|
| 5,768,290 A * | 6/1998 | Akamatsu | G11C 29/02 257/E23.179 |
| 5,821,849 A * | 10/1998 | Dietsch | H01H 85/30 337/160 |
| 8,657,011 B2 * | 2/2014 | Vyas et al. | 166/335 |
| 2008/0084215 A1 * | 4/2008 | Itten et al. | 324/510 |
| 2011/0071966 A1 * | 3/2011 | Holley | G05B 23/0243 706/12 |

OTHER PUBLICATIONS

Tamus et al., Application of voltage response measurement on low voltage cables, IEEE Elec. Insulation Conf, Montreal Canada, May 31, 2009, p. 444-447.*

(Continued)

*Primary Examiner* — Thomas Valone
(74) *Attorney, Agent, or Firm* — GE Global Patent Operation

(57) ABSTRACT

A method of testing a fuse in apparatus for monitoring electrical insulation surrounding first and second electrical conductors in a cable, the fuse being connected to the conductors, comprises: applying an electrical signal, with respect to a reference, to the fuse from a source; obtaining a value for the resistance of the insulation with respect to the reference; determining if the resistance value is greater than a fuse test resistance threshold and, if it is, causing the application of the signal to cease; and monitoring the decay of the signal to determine if the time for it to decay below a set value exceeds a set time limit, indicative of the fuse being satisfactory, or is less than the limit indicative of the fuse being blown.

21 Claims, 2 Drawing Sheets

(56) References Cited

OTHER PUBLICATIONS

Reuter, et al., Impact of multistress aging on the dielectric relaxation behaviour of XLPE cable insulation, 2004 Inter. Conf. on Solid Dielectrics, Jul. 5-9, 2004, p. 1-4.*
Electrical and Electronic Symbols, RapidTables dot com, p. 1-4, 2012, http://www.rapidtables.com/electric/electrical_symbols.htm.*
Stack Exchange—Electrical Engineering, "How to measure gigaohm resistors?" p. 1-3, Feb. 16, 2011.*
Linear Technology, LT1169 Dual Low Noise, Picoampere Bias Current, JFET INput OP Amp, p. 1-12, 1994, http://cds.linear.com/docs/en/datasheet/1169fa.pdf.*
Extended European Search Report from corresponding EP Application No. 12183277.8, Dated Feb. 6, 2013.

* cited by examiner

TESTING A FUSE

FIELD OF THE INVENTION

This invention relates to testing a fuse, in particular in a device for monitoring the condition of electrical insulation surrounding electrical conductors in a cable.

BACKGROUND OF THE INVENTION

On-line monitoring of the characteristics of an electrical umbilical cable, such as an underwater (for example subsea) well control system umbilical cable, is performed by an umbilical monitoring device (UMD) which applies an electrical signal to conductors of the umbilical cable with respect to earth and uses various measuring techniques to ascertain that the characteristics of the umbilical cable are adequate for its intended remaining lifetime. The measuring techniques in such a UMD employ electronic amplifiers which are protected from excessive voltages on the live system by a fast blow fuse in series with the live system. The problem is that, if the fuse has blown, the UMD believes that it is connected to an umbilical cable with a high electrical insulation resistance, even if the insulation has completely failed.

BRIEF DESCRIPTION OF THE INVENTION

According to this invention from one aspect, there is provided a method of testing a fuse in apparatus for monitoring electrical insulation surrounding first and second electrical conductors in a cable, the fuse being connected to the conductors. The method comprises applying an electrical signal, with respect to a reference, to the fuse from a source. The method further comprises obtaining a value for the resistance of the insulation with respect to the reference, and determining if the resistance value is greater than a fuse test resistance threshold and, if it is, causing application of the signal to cease. The method further comprises monitoring the decay of the signal to determine if the time for it to decay below a set value exceeds a set time limit, indicative of the fuse being satisfactory, or is less than the limit indicative of the fuse being blown.

According to this invention from another aspect, there is provided apparatus for monitoring electrical insulation surrounding first and second electrical conductors in a cable, the apparatus including a fuse for connection to the conductors. The apparatus comprises: means for applying an electrical signal, with respect to a reference, to the fuse from a source; means adapted for obtaining a value for the resistance value of the insulation with respect to the reference; means adapted for determining if the resistance value is greater than a fuse test resistance threshold and, if it is, causing the application of the signal to cease; and means adapted for monitoring the decay of the signal to determine if the time for it to decay below a set value exceeds a set time limit, indicative of the fuse being satisfactory, or is less than the limit, indicative of the fuse being blown.

In embodiments, the cable comprises an umbilical cable of an underwater well control system.

The value for the resistance of the insulation with respect to the reference is typically obtained using a measurement of the voltage applied to the fuse with respect to the reference and a measurement of the current through the fuse, taking into account the effective resistance of means for measuring the voltage and the effective resistance of means for measuring the current.

The fuse could be connected to each of the conductors by signal splitting means comprising first and second resistors. In this case, obtaining the value for the resistance of the insulation with respect to the reference typically takes into account the effective resistance of the signal splitting means.

In embodiments, the reference is earth.

DETAILED DESCRIPTION OF THE INVENTION

The embodiment to be described operates in general as follows. Apparatus providing a UMD applies a measuring signal in the form of DC voltage via a fuse, and with reference to earth, to each of two conductors carrying AC in an umbilical cable which are surrounded by electrical insulation. The UMD derives a value for the resistance of the insulation between the conductors and earth and, if this is determined to be above a fuse test resistance threshold value, it then causes application of the measuring signal to the fuse to cease. If the fuse is satisfactory and the UMD is in electrical connection with the umbilical cable, the capacitance of the insulation with reference to earth will be fully charged and it will take some time for the signal to decay. This decay is monitored and, if the time it takes to decay below a set limit is above a threshold value, the fuse test has passed (i.e. the fuse is satisfactory and provides electrical connectivity). If the fuse has blown and the UMD is not connected electrically to the umbilical cable, the signal will decay almost immediately, since the capacitance was not fully charged, from which the UMD determines that the fuse has blown.

Figure 1:
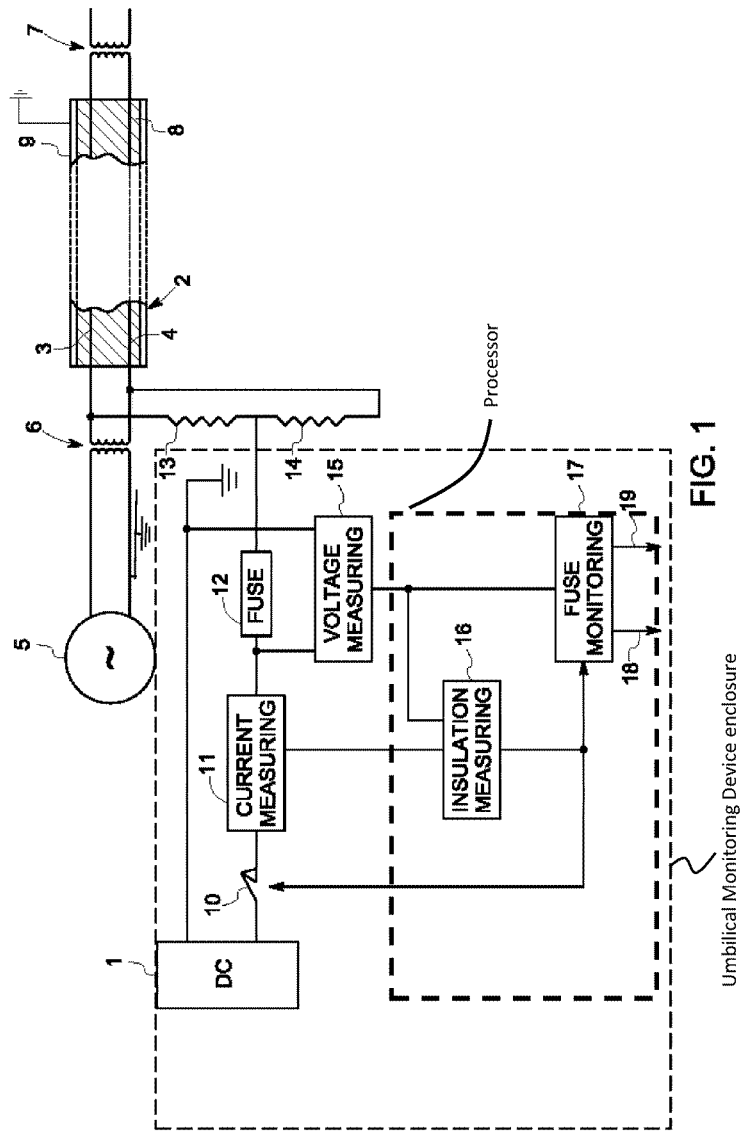
FIG. 1 is a schematic diagram of an embodiment of apparatus incorporating the invention.

Referring to FIG. 1, reference numeral 1 designates a DC voltage source (typically supplying a nominal 50 volts) in a UMD and reference numeral 2 designates an umbilical cable of a subsea well control system such as a subsea hydrocarbon well production control system. At least first and second electrical conductors 3 and 4 are in the umbilical cable 2, the conductors 3 and 4 supplying AC from a topside AC source 5 and a topside transformer 6 to subsea equipment via a subsea transformer 7. The conductors 3 and 4 are surrounded by electrical insulation 8 and the umbilical cable has a protective armour sheath 9 in contact with sea water and therefore at earth potential. The DC voltage source 1 can be connected between conductors 3 and 4 and earth via a switch 10 (when closed), current measuring circuitry 11 and a fuse 12 connected to the conductors via signal splitting circuitry comprising a resistor 13 connected to conductor 3 and an equal value resistor 14 connected to conductor 4. Typically, the connection to earth could be to the sheath 9. Since conductors 3 and 4 are connected across the secondary winding of transformer 6 and the primary winding of transformer 7, they effectively act as a single conductor as far as DC is concerned.

The voltage applied to fuse 12 with reference to earth is measured by voltage measuring circuitry 15 and the voltage measurement from circuitry 15 and the current measurement from circuitry 11 are supplied to insulation resistance measuring circuitry 16.

According to embodiments of the invention, the method of testing the fuse 12 is as follows.

With switch 10 closed, a DC voltage is applied from source 1 and circuitry 11 and circuitry 15 feed current and voltage measurements to insulation measuring circuitry 16. The circuitry 16 includes a microprocessor which is programmed to calculate a value for the resistance of the insulation between conductors 3 and 4 and earth (see below). Circuitry 16 contains a threshold detector and, in response to the value of the insulation resistance exceeding a fuse test value, an output from circuitry 16 opens the switch 10, thus disconnecting the supply of DC, and enables a fuse monitoring stage represented by block 17. The fuse monitoring stage is provided by an algorithm which is carried out by the microprocessor of circuitry 16 to monitor the decay of the voltage measured by circuitry 15.

If the fuse 12 is satisfactory, the capacitance of the insulation between conductors 3 and 4 and earth will have been fully charged and the voltage will take some time to decay, whereas if the fuse 12 is blown, the capacitance will not have been charged and the voltage will decay almost immediately.

The algorithm is such that the time it takes for the decaying voltage to fall below a set value is detected and if the time exceeds a set time limit (from which time the capacitance of the insulation between conductors 3 and 4 and earth can be calculated), a fuse satisfactory signal is output from a port 18 and if the time is less than the set limit, a fuse fail (blown) signal is output from a port 19.

Figure 2:
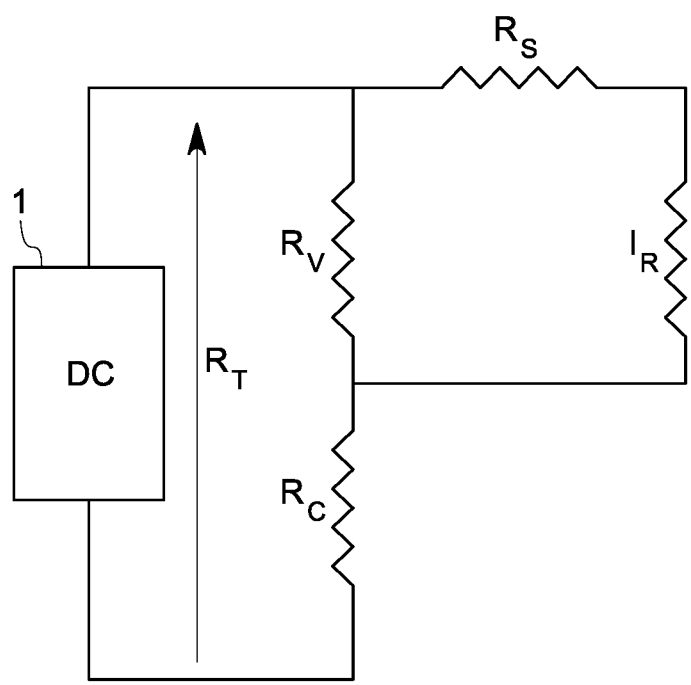
FIG. 2 is a circuit diagram for use in explaining the calculation of a value for insulation resistance.

The calculation of a value for the resistance of the insulation between conductors 3 and 4 and earth by the microprocessor of circuitry 16 is as follows. FIG. 2 is a simplified circuit diagram of the above system as far as DC is concerned, in which:

$I_R$ is a value for the insulation resistance between conductors 3 and 4 and earth;

$R_T$ is a total resistance value, as measured by circuitry 16 as the voltage measured by circuitry 15 divided by the current measured by circuitry 11;

$R_S$ is the known effective resistance value of the splitting circuitry, namely half of the value of each of resistors 13 and 14;

$R_V$ is the known effective resistance value of voltage measuring circuitry 15; and $R_C$ is the known effective resistance value of the current measuring circuitry 11. Insulation measuring circuitry 16 calculates $I_R$ from:

$$I_R = \frac{R_T R_V + R_T R_S - R_C R_V - R_C R_S - R_V R_S}{R_C + R_V - R_T}$$

Instead of being connected to signal splitting circuitry, the fuse 12 could be connected to conductors 3 and 4 via a centre tap of the secondary winding of transformer 6. Also, the conductors 3 and 4 could be carrying DC instead of AC in which case signal splitting circuitry is necessary.

Another embodiment relates to an apparatus for monitoring electrical insulation surrounding first and second electrical conductors in a cable, the apparatus including a fuse for connection to the conductors. The apparatus comprises means (e.g., a first circuit or circuit portion as described hereinabove) for applying an electrical signal, with respect to a reference, to the fuse from a source. The apparatus further comprises means (e.g., a second circuit or circuit portion as described hereinabove) adapted for obtaining a value for the resistance of the insulation with respect to the reference. The apparatus further comprises means (e.g., a third circuit or circuit portion as described hereinabove) adapted for determining if the resistance value is greater than a fuse test resistance threshold and, if it is, causing the application of the signal to cease. The apparatus further comprises means (e.g., a fourth circuit or circuit portion as described hereinabove) adapted for monitoring the decay of the signal to determine if the time for it to decay below a set value exceeds a set time limit, indicative of the fuse being satisfactory, or is less than the limit, indicative of the fuse being blown.

In another embodiment, the apparatus is adapted (operatively configured) so that the value for the resistance of the insulation with respect to the reference is obtained using a measurement of the voltage applied to the fuse with respect to the reference and a measurement of the current through the fuse, taking in account the effective resistance of means for measuring the voltage and the effective resistance of means for measuring the current.

In another embodiment, the fuse is connected to each of the conductors by signal splitting means comprising first and second resistors.

In another embodiment, the apparatus is adapted (operatively configured) so that obtaining the value for the resistance of the insulation with respect to the reference takes into account the effective resistance of the signal splitting means.

According to an aspect, an advantage of using the invention is provision of knowledge that a fuse in a UMD is satisfactory while testing on a live system without having to shut down the system, remove the fuse and test it in isolation.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects.

This written description uses examples to disclose several embodiments of the inventive subject matter and also to enable a person of ordinary skill in the art to practice the embodiments of the inventive subject matter, including making and using any devices or systems and performing any incorporated methods. The patentable scope of the inventive subject matter is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described systems and methods without departing from the spirit and scope of the inventive subject matter herein involved, it is intended that all of the subject matter of the above description or shown in the accompanying drawings shall be interpreted merely as examples illustrating the inventive concept herein and shall not be construed as limiting the inventive subject matter.

The invention claimed is:

1. A method of testing insulation using an umbilical monitoring device, the method comprising:
   applying, using the umbilical monitoring device, an electrical DC measuring signal comprising a current feed having a voltage to an umbilical cable and to earth, wherein the cable carries AC and comprises insulation surrounding a first and a second electrical conductor in the umbilical cable, and wherein the umbilical monitoring device further comprises a fuse connected to the first and the second electrical conductor;
   measuring, using a processor, an insulation resistance value using a voltage and current measuring circuitry of the umbilical monitoring device, wherein (i) an insulation resistance value below an insulation resistance threshold value indicates the fuse is not blown and (ii) an insulation resistance value above the insulation value threshold indicates a high insulation resistance or either the fuse has blown or the umbilical monitoring device is not connected to the umbilical cable, and causing, using the processor, the application of the electrical DC measuring signal current feed to cease; and
   determining, using the processor, whether the insulation resistance value above the insulation value threshold is due to high insulation resistance or either a blown fuse or the umbilical monitoring device is not connected to the umbilical cable, comprising:
   measuring a time for the electrical DC measuring signal voltage to decay to calculate capacitance, wherein (i) if the capacitance is above a threshold value, the fuse is not blown and (ii) if the capacitance is below a threshold value, either fuse has blown or the umbilical monitoring device is not connected to the umbilical cable.

2. The method according to claim 1, wherein the umbilical cable is an umbilical cable of an underwater well control system.

3. The method according to claim 1, wherein the method is performed on a live system where the umbilical cable is receiving power.

4. The method according to claim 1, wherein the electrical DC measuring signal induces a leakage current to earth via the insulation of the cable.

5. The method according to claim 1, wherein the step of measuring an insulation resistance value comprises:
   using a measurement of the electrical DC measuring signal voltage applied to the umbilical cable with respect to a voltage reference and a measurement of current through the fuse.

6. The method according to claim 5, further comprising taking into account an effective resistance of a circuit for measuring the current.

7. The method according to claim 1, wherein the fuse is connected to each of the conductors by a first resistor and a second resistor.

8. The method according to claim 7, wherein obtaining the value for the resistance of the insulation takes into account an effective resistance of the first resistor and the second resistor, wherein the value for the first resistor and the value for the second resistor are approximately equal.

9. The method according to claim 1, wherein the step of measuring an insulation resistance value comprises comparing a voltage measurement to a voltage reference.

10. The method according to claim 9, wherein the voltage reference is earth.

11. The method according to claim 1, wherein the decay is exponential decay.

12. An apparatus for testing insulation, the apparatus comprising:
   an umbilical monitoring device for applying an electrical DC measuring signal comprising a current feed having a voltage to an umbilical cable and to earth, wherein the cable carries AC and comprises insulation surrounding a first and a second electrical conductor in the umbilical cable, and wherein the umbilical monitoring device further comprises a fuse connected to the first and the second electrical conductor; and
   a processor adapted for measuring an insulation resistance value using a voltage and current measuring circuitry of the umbilical monitoring device, wherein (i) an insulation resistance value below an insulation resistance threshold value indicates the fuse is not blown and (ii) an insulation resistance value above the insulation value threshold indicates either a high insulation resistance or that the fuse has blown or the umbilical monitoring device is not connected to the umbilical cable, and causes the application of the electrical DC measuring signal current feed to cease;
   wherein the processor is further adapted to determine whether the insulation resistance value above the insulation value threshold is due to high insulation resistance or either a blown fuse or the umbilical monitoring device is not connected to the umbilical cable by measuring a time for the electrical DC measuring signal voltage to decay to calculate capacitance, wherein (i) if the capacitance is above a threshold value, the fuse is not blown and (ii) if the capacitance is below a threshold value, either the fuse has blown or the umbilical monitoring device is not connected to the umbilical cable.

13. The apparatus according to claim 12, wherein the umbilical cable is an umbilical cable of an underwater well control system.

14. The apparatus according to claim 12, wherein the apparatus tests insulation on a live system where the umbilical cable is receiving power.

15. The apparatus according to claim 12, wherein the electrical DC measuring signal induces a leakage current to earth via the insulation of the cable.

16. The apparatus according to claim 12, wherein processor measures an insulation resistance value by using a measurement of the electrical DC measuring signal voltage applied to the umbilical cable with respect to a voltage reference and a measurement of current through the fuse.

17. The apparatus according to claim 16, further comprising wherein the processor takes into account an effective resistance of a circuit for measuring the current.

18. The apparatus according to claim 12, wherein the fuse is connected to each of the conductors by a first resistor and a second resistor.

19. The apparatus according to claim 18, wherein the processor obtains the value for the resistance of the insulation taking into account an effective resistance of the first resistor and the second resistor, wherein the value for the first resistor and the value for the second resistor are approximately equal.

20. The method according to claim 12, wherein the step of measuring an insulation resistance value, further comprises comparing a voltage measurement to a voltage reference.

21. The method according to claim 12, wherein the voltage reference is earth.

* * * * *